(12) United States Patent
Eckel et al.

(10) Patent No.: US 9,412,853 B2
(45) Date of Patent: Aug. 9, 2016

(54) PROTECTIVE DEVICE FOR A VOLTAGE-CONTROLLED SEMICONDUCTOR SWITCH

(75) Inventors: Hans-Günter Eckel, Rostock (DE); Steffen Pierstorf, Nuremberg (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 14/356,662

(22) PCT Filed: Nov. 7, 2011

(86) PCT No.: PCT/EP2011/069523
§ 371 (c)(1),
(2), (4) Date: Jun. 2, 2014

(87) PCT Pub. No.: WO2013/068028
PCT Pub. Date: May 16, 2013

(65) Prior Publication Data
US 2014/0320198 A1    Oct. 30, 2014

(51) Int. Cl.
H03K 5/08       (2006.01)
H01L 29/739     (2006.01)
H03K 17/0812    (2006.01)
H02H 9/04       (2006.01)

(52) U.S. Cl.
CPC ............ *H01L 29/7393* (2013.01); *H02H 9/04* (2013.01); *H03K 17/08126* (2013.01)

(58) Field of Classification Search
USPC ....................................... 327/309
See application file for complete search history.

(56) References Cited

U.S. PATENT DOCUMENTS 4,636,713 A * 1/1987 Stefani ............................ 323/350
5,202,619 A * 4/1993 Furuhata et al. ............. 323/349

(Continued)

FOREIGN PATENT DOCUMENTS

CN    1348626 A    5/2002
CN    101150250 A   3/2008

(Continued)

OTHER PUBLICATIONS

Schumann et al.: "Influence of the Gate Drive on the Short-Circuit Type II and Type III Behaviour of HV-IGBT" University of Rostock, Germany PCIM2010 May 4-6, 2010, Nuremberg, Germany VDE-Verlag Berlin pp. 709-714 ISBN: 978-3-8007-3229-6.

*Primary Examiner* — Lincoln Donovan
*Assistant Examiner* — Patrick Chen
(74) *Attorney, Agent, or Firm* — Laurence Greenberg; Werner Stemer; Ralph Locher

(57) ABSTRACT

A protective device for a voltage-controlled semiconductor switch has a gate connection, a power emitter connection, an auxiliary emitter connection and a collector connection. The semiconductor switch can switch a current between the collector connection and the power emitter connection. A voltage-limiting device limits the voltage between the gate connection and the power emitter connection. A deactivation device is connected to the voltage-limiting device and deactivates the voltage-limiting device during a switch-on of the semiconductor switch.

11 Claims, 1 Drawing Sheet

(56) References Cited

U.S. PATENT DOCUMENTS

| | | |
|---|---|---|
| 6,054,890 A | 4/2000 | Giacomo |
| 8,063,597 B2 | 11/2011 | Thomsen |
| 8,350,601 B2 | 1/2013 | Nagata et al. |
| 8,531,851 B2 | 9/2013 | Chen |
| 2005/0068080 A1* | 3/2005 | Lee ............................ 327/199 |
| 2005/0088216 A1 | 4/2005 | Arndt et al. |
| 2011/0133790 A1* | 6/2011 | Nagata et al. ................. 327/109 |

FOREIGN PATENT DOCUMENTS

| | | |
|---|---|---|
| CN | 101882864 A | 11/2010 |
| CN | 102088280 A | 6/2011 |
| EP | 0814564 A1 | 12/1997 |
| EP | 1191692 A1 | 3/2002 |
| WO | 2009103584 A1 | 8/2009 |
| WO | WO 2011052398 A1 * | 5/2011 |

* cited by examiner

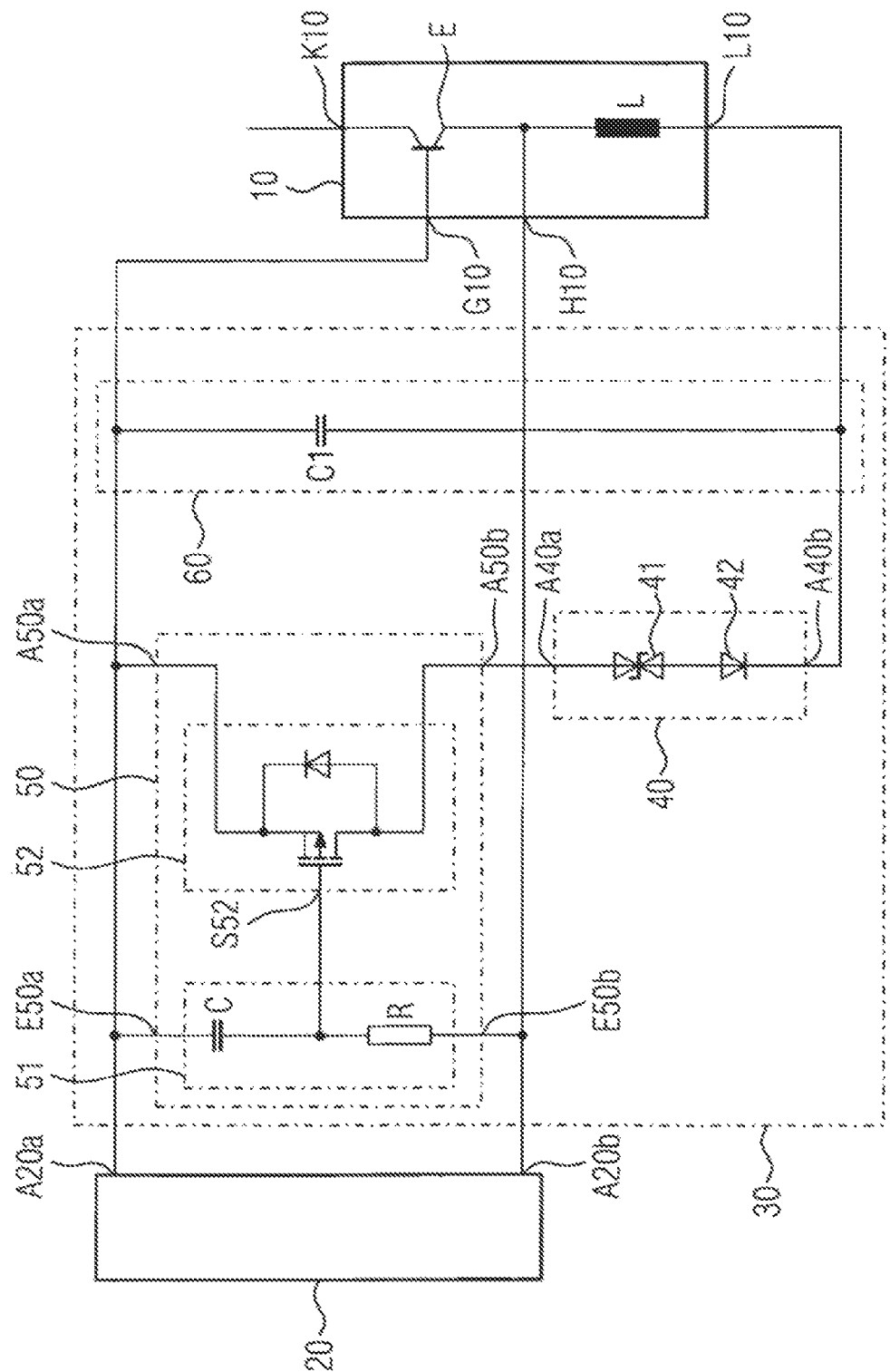

PROTECTIVE DEVICE FOR A VOLTAGE-CONTROLLED SEMICONDUCTOR SWITCH

BACKGROUND OF THE INVENTION

Field of the Invention

The invention relates to a protective device for a voltage-controlled semiconductor switch having a gate connection, a power emitter connection, an auxiliary emitter connection and a collector connection, wherein the semiconductor switch can switch a current between the collector connection and the power emitter connection. A protective device such as this can be used, for example, for voltage-controlled IGBT semiconductor switches (IGBT: insulated-gate bipolar transistor) or MOSFET semiconductor switches (MOSFET: metal-oxide semiconductor field-effect transistor).

Very high currents may flow in voltage source converters owing to short-circuits or ground faults in the load, it being possible in certain circumstances for said high currents to destroy the voltage-controlled semiconductor switches used in the converters. Whilst the switch-on connection of a voltage-controlled semiconductor switch to an already existing short-circuit is withstood by modern semiconductor switches usually for intervals of at least 10 µs, without this resulting in destruction—the interval is usually sufficient to identify a short-circuit and to disconnect—a short-circuit is significantly more critical in the case of a semiconductor switch which is already switched on and conducting. A short-circuit such as this is referred to as a "type 2" short-circuit (cf. conference paper "Influence of the Gate Drive on the Short-Circuit Type 2 and Type 3 Behaviour of HV-IGBT" (PCIM2010, May 4-6, 2010, Nuremberg, Germany, VDE-Verlag Berlin, ISBN: 978-3-8007-3229-6). It is characteristic of a type 2 short-circuit that a short-circuit current peak, which is significantly higher than the static short-circuit current, and a voltage peak occur at the point of transition from the dynamic short-circuit current peak to the static short-circuit current. The invention is based on the problem of specifying a protective device for a voltage-controlled semiconductor switch, which protective device also reliably protects in the event of a type 2 short-circuit.

BRIEF SUMMARY OF THE INVENTION

This problem is solved according to the invention by means of a protective device. Advantageous embodiments of the protective device according to the invention are specified in the dependent claims.

Accordingly, a protective device is provided according to the invention, said protective device having: a voltage-limiting device, which limits the voltage between the gate connection and the power emitter connection, and a deactivation device, which is connected to the voltage-limiting device and deactivates the voltage-limiting device during the switch-on of the semiconductor switch.

One essential advantage of the protective device according to the invention consists in that the limiting, provided according to the invention, of the voltage between the gate connection and the power emitter connection in the event of a short-circuit also causes a reduction in the voltage between the gate connection and the auxiliary emitter connection, as a result of which the short-circuit current amplitude which occurs is advantageously reduced.

A further essential advantage of the protective device according to the invention consists in the deactivation, provided according to the invention, of the voltage-limiting device during the switch-on phase of the semiconductor switch in order to avoid or minimize switching losses during the switch-on, which switching losses would otherwise occur as a result of a reduction in the gate-power emitter voltage. In summary, therefore, an optimum behavior during a type 2 short-circuit is achieved by means of the voltage-limiting device provided according to the invention, wherein it is ensured, however, that the losses during the switch-on of the semiconductor switch during normal operation are not significantly increased.

According to a particularly preferred configuration of the protective device, it is provided that the protective device has a capacitive coupling device, which effects a capacitive coupling between the gate connection and the power emitter connection. By means of a capacitive coupling between the gate connection and the power emitter connection, the gate-power emitter voltage is advantageously raised once the short-circuit amplitude has been reached, which leads to a particularly smooth transition from the short-circuit current amplitude to the static short-circuit current and hence to a particularly low surge peak.

It is considered to be advantageous for the voltage between the gate connection and the auxiliary emitter connection to be applied to the input-side of the deactivation device and for said deactivation device to deactivate the voltage-limiting device on the basis of the gate-auxiliary emitter voltage.

The output-side of the deactivation device is preferably connected in series with the voltage-limiting device.

In order to achieve a reliable deactivation of the voltage-limiting device during the switch-on of the semiconductor switch, it is considered to be advantageous for the deactivation device to be configured such that, in the event of a sudden change in the gate-auxiliary emitter voltage which is present between the gate connection and the auxiliary emitter connection, it deactivates the voltage-limiting device.

In order that the deactivation of the voltage-limiting device is automatically ended once the switch-on process is finished, it is considered to be advantageous for the deactivation device to have at least one timing element, the time constant of which at least also determines the duration of the deactivation of the voltage-limiting device after a sudden change in the gate-auxiliary emitter voltage.

Preferably, the timing element is an RC timing element which is formed by at least one capacitor and at least one resistor.

The deactivation device preferably has a voltage-controlled switch element; a control voltage generated using the gate-auxiliary emitter voltage being applied to the control connection of said switch element.

The gate-auxiliary emitter voltage is preferably applied to the control connection of the voltage-controlled switch element via a timing element—for example the timing element already mentioned above. By way of example, the timing element may be an RC element which is formed by at least one capacitor and at least one resistor.

The invention also relates to an arrangement having a voltage-controlled semiconductor switch, a protective device as has been described above and an activation circuit for activating the semiconductor switch, wherein the activation circuit is connected to the gate connection and the auxiliary emitter connection and controls the voltage-controlled semiconductor switch by means of the gate-auxiliary emitter voltage.

With respect to the advantages of the arrangement according to the invention, reference is made to the statements above in connection with the advantages of the protective device according to the invention, since the advantages of the arrangement according to the invention substantially correspond to those of the protective device according to the invention.

The invention also relates to a method for protecting a voltage-controlled semiconductor switch which is equipped with a gate connection, a power emitter connection, an auxiliary emitter connection and a collector connection. The invention provides that the voltage between the gate connection and the power emitter connection is limited by a voltage-limiting device when the voltage-controlled semiconductor switch is switched on, and the voltage-limiting device is deactivated by a deactivation device during the switch-on of the semiconductor switch.

With respect to the advantages of the method according to the invention, reference is made to the statements above in connection with the advantages of the protective device according to the invention, since the advantages of the method according to the invention substantially correspond to those of the protective device according to the invention.

According to a particularly preferred configuration of the method, it is provided that the voltage between the gate connection and the auxiliary emitter connection is monitored for a sudden voltage change, and the voltage-limiting device is deactivated in the event of such a sudden voltage change occurring.

BRIEF DESCRIPTION OF THE DRAWING

The invention is explained in more detail below on the basis of an exemplary embodiment; in this case, a FIGURE shows an exemplary embodiment of an arrangement according to the invention which is equipped with a protective device according to the invention. The method according to the invention will also be explained by way of example on the basis of the arrangement illustrated in the FIGURE.

DESCRIPTION OF THE INVENTION

The FIGURE shows an arrangement having a voltage-controlled semiconductor switch 10 which has a collector connection K10, a power emitter connection L10, an auxiliary emitter connection H10 and a gate connection G10. The voltage-controlled semiconductor switch 10 may be, for example, an IGBT, that is to say an insulated-gate bipolar transistor, or a MOSFET (MOSFET: metal-oxide semiconductor field-effect transistor). The auxiliary emitter connection H10 and the power emitter connection L10 of the semiconductor switch 10 differ in terms of their line lengths to the actual physical emitter connection point E. While the auxiliary emitter connection H10 is connected to the physical emitter connection point E by a very short electrical line, the electrical line between the power emitter connection L10 and the physical emitter connection point E is markedly longer. Thus, in electrical terms, the auxiliary emitter connection H10 and the power emitter connection L10 are coupled to one another via an inductance L which is determined by the line length of the line up to the power emitter connection L10. The line length between the physical emitter connection point E and the power emitter connection L10 is usually in the range between 1 and 5 cm.

For the operation of the semiconductor switch 10, the auxiliary emitter connection H10 is used to feed in a control voltage and the power emitter connection L10 is used to connect the electrical load. Thus, the load current flows via the collector connection K10 and the power emitter connection L10, and the control current flows via the gate connection G10 and the auxiliary emitter connection H10.

The semiconductor switch 10 is activated by an activation circuit 20, the output A20a of said activation circuit being connected to the gate connection G10 of the semiconductor switch 10 and the output A20b of said activation circuit being connected to the auxiliary emitter connection H10.

In the exemplary embodiment shown in the FIGURE, the activation circuit 20 switches on the semiconductor switch 10, for example, by generating a positive voltage between the gate connection G10 and the auxiliary emitter connection H10. It switches off the semiconductor switch 10 by disconnecting the voltage between the gate connection G10 and the auxiliary emitter connection H10. It can be seen in the FIGURE that a protective device 30 is connected between the activation circuit 20 and the semiconductor switch 10. The protective device 30 comprises a voltage-limiting device 40 (in the form of a voltage-limiting circuit), a deactivation device 50 (in the form of a deactivation circuit) and a capacitive coupling device 60 (in the form of a coupling circuit).

The capacitive coupling device 60 is formed by a capacitor C1 which is connected between the gate connection G10 and the power emitter connection L10 of the semiconductor switch 10.

The deactivation device 50 has two inputs E50a and E50b, of which the input E50a is connected to the gate connection G10 of the semiconductor switch and the input E50b is connected to the auxiliary emitter connection H10 of the semiconductor switch 10. The two inputs E50a and E50b are therefore likewise connected to the two outputs A20a and A20b of the activation circuit 20.

The output-side of the deactivation device 50 is connected by means of its output A50a to the gate connection G10 of the semiconductor switch 10. Another output A50b is connected to a connection A40a of the voltage-limiting device 40. A further connection A40b of the voltage-limiting device 40 is connected to the power emitter connection L10 of the semiconductor switch 10.

A series circuit is formed by the output-side interconnection of the deactivation device 50 and the voltage-limiting device 40, said series circuit connecting the gate connection G10 to the power emitter connection L10.

In the exemplary embodiment according to FIG. 1, the voltage-limiting device 40 has a transient-voltage-suppression diode 41 and a diode 42. The function of the two diodes 41 and 42 consists in reducing the voltage between the gate connection G10 and the power emitter connection L10 in the event of a short-circuit, as a result of which the voltage between the gate connection G10 and the auxiliary emitter connection H10 is also reduced, which in turn leads to a reduction in the short-circuit amplitude.

The deactivation device 50 has a timing element 51 and a voltage-controlled switch element 52 which is connected to the timing element 51 on the input-side. The output-side of the voltage-controlled switch element 52 forms the outputs A50a and A50b of the deactivation device 50. A control voltage is applied to the control connection S52 of the switch element 52 via the timing element 51, said control voltage being formed by the voltage between the gate connection G10 and the auxiliary emitter connection H10.

In the exemplary embodiment according to the FIGURE, the timing element 51 is an RC timing element which is formed by a resistor R and a capacitor C. The function of the timing element 51 consists in switching off the switch element 52 or causing said switch element to be switched off when the semiconductor switch 10 is switched on, with the result that the deactivation device 50 deactivates the voltage-limiting device 40.

As has already been mentioned, the semiconductor switch 10 is switched on in the exemplary embodiment shown in the FIGURE by applying a positive gate-auxiliary emitter voltage to the gate connection G10 and the auxiliary emitter connection H10 of the semiconductor switch 10. If the potential at the gate connection G10 is raised during the switch-on, then the switch element 52 only remains still disconnected by means of the control voltage present at the control connection S52 until the capacitor C of the timing element 51 has charged up, though. In the time interval in which the switch element 52 remains disconnected, the voltage-limiting device 40 is or remains deactivated, with the result that said voltage-limiting device remains without influence on the switch-on phase of the semiconductor switch 10. By means of the deactivation of the voltage-limiting device 40 in the switch-on phase, the current increase di/dt is prevented from being reduced during the switch-on; as a result of this, the switch-on losses when the semiconductor switch 10 is switched on are significantly lowered.

As soon as the capacitor C has been charged up via the resistor R, the switch element 52 is switched on and the voltage-limiting device 40 is activated, with the result that said voltage-limiting device is able, in the event of a short-circuit in the load, to reduce the voltage between the gate connection G10 and the power emitter connection L10 and hence to reduce the voltage between the gate connection G10 and the auxiliary emitter connection H10 and to cause a reduction in the short-circuit current amplitude in the event of a short-circuit.

The capacitive coupling device 60 has the task of raising the gate-emitter voltage again once the short-circuit current amplitude has been reached in the event of a short-circuit and thus of leading to a smoother transition from the short-circuit current amplitude to the static short-circuit current and hence to a lower surge peak.

In the exemplary embodiment shown in the FIGURE, the voltage-limiting device 40 has a transient-voltage-suppression diode 41 and a diode 42. Alternatively, the voltage-limiting device can also be formed by a single Zener diode and/or a diode in combination with a pre charged capacitor.

The voltage-controlled switch element 52 can be, for example, a MOSFET transistor, the source connection of which is at the gate potential and the gate of which is connected to the auxiliary emitter connection H10 of the semiconductor switch 10 via a series resistor (for example the resistor R of the timing element 51). Although the invention has been illustrated and described in more detail on the basis of the preferred exemplary embodiment, the invention is not restricted by the disclosed example and other variations may be derived here from by a person skilled in the art without departing from the scope of protection of the invention.

LIST OF REFERENCE SIGNS

10 semiconductor switch
20 activation circuit
30 protective device
40 voltage-limiting device
41 transient-voltage-suppression diode
42 diode
50 deactivation device
51 timing element
52 switch element
60 coupling device
A20a output
A20b output
A40a connection
A40b connection
A50a output
A50b output
C capacitor
di/dt current increase
E emitter connection point
E50a input
E50b input
G10 gate connection
H10 auxiliary emitter connection
K10 collector connection
L inductance
L10 power emitter connection
R resistor
S52 control connection
T transistor

The invention claimed is:

1. A protective device for a voltage-controlled semiconductor switch having a gate connection, a power emitter connection, an auxiliary emitter connection and a collector connection, wherein the voltage-controlled semiconductor switch can switch a current between the collector connection and the power emitter connection, the protective device comprising:
a voltage-limiting device for limiting a voltage between the gate connection and the power emitter connection; and
a deactivation device connected to said voltage-limiting device and deactivating said voltage-limiting device during a switch-on of the voltage-controlled semiconductor switch, said deactivation device having at least one timing element, wherein a time constant of said timing element at least also determines a duration of a deactivation of said voltage-limiting device after a sudden change in a gate-auxiliary emitter voltage.

2. The protective device according to claim 1, further comprising a capacitive coupling device which affects a capacitive coupling between the gate connection and the power emitter connection.

3. The protective device according to claim 1, wherein a gate-auxiliary emitter voltage between the gate connection and the auxiliary emitter connection is applied to an input-side of said deactivation device, said deactivation device deactivating said voltage-limiting device on a basis of the gate-auxiliary emitter voltage.

4. The protective device according to claim 1, wherein said deactivation device has an output-side connected in series with said voltage-limiting device.

5. The protective device according to claim 1, wherein said deactivation device is configured such that, in an event of a sudden change in a gate-auxiliary emitter voltage present between the gate connection and the auxiliary emitter connection, said deactivation device deactivates said voltage-limiting device.

6. The protective device according to claim 1, wherein said timing element is an RC timing element having at least one capacitor and at least one resistor.

7. The protective device according to claim 1, wherein said deactivation device has a voltage-controlled switch element with a control connection, a control voltage generated using a gate-auxiliary emitter voltage being applied to said control connection of the voltage-controlled switch element.

8. The protective device according to claim 7, wherein the gate-auxiliary emitter voltage is applied to said control connection of said voltage-controlled switch element via said timing element.

9. A configuration, comprising:
- a voltage-controlled semiconductor switch having a gate connection, a power emitter connection, an auxiliary emitter connection and a collector connection;
- a protective device having a voltage-limiting device for limiting a voltage between said gate connection and said power emitter connection and a deactivation device connected to said voltage-limiting device and deactivating said voltage-limiting device during a switch-on of said voltage-controlled semiconductor switch, said deactivation device having at least one timing element, wherein a time constant of said timing element at least also determines a duration of a deactivation of said voltage-limiting device after a sudden change in a gate-auxiliary emitter voltage; and
- an activation circuit for activating said voltage-controlled semiconductor switch, said activation circuit connected to said gate connection and said auxiliary emitter connection and controls said voltage-controlled semiconductor switch by means of a gate-auxiliary emitter voltage.

10. A method for protecting a voltage-controlled semiconductor switch equipped with a gate connection, a power emitter connection, an auxiliary emitter connection and a collector connection, which comprises the steps of:
- limiting a voltage between the gate connection and the power emitter connection via a voltage-limiting device when the voltage-controlled semiconductor switch is fully switched on; and
- deactivating the voltage-limiting device via a deactivation device during a switching-on period of the voltage-controlled semiconductor switch, the deactivation device having at least one timing element, wherein a time constant of the timing element at least also determines a duration of a deactivation of the voltage-limiting device after a sudden change in a gate-auxiliary emitter voltage.

11. The method according to claim 10, which further comprises:
- monitoring a voltage between the gate connection and the auxiliary emitter connection for a sudden voltage change; and
- deactivating the voltage-limiting device in an event of the sudden voltage change occurring.

* * * * *